（12）United States Patent
Kubota et al.

(10) Patent No.: US 8,519,508 B2
(45) Date of Patent: Aug. 27, 2013

(54) SEMICONDUCTOR DEVICE HAVING AN ANTI-FUSE ELEMENT AND A TRANSISTOR WITH A POCKET REGION

(75) Inventors: Yoshitaka Kubota, Kanagawa (JP); Hiroshi Tsuda, Kanagawa (JP); Kenichi Hidaka, Kanagawa (JP); Takuji Onuma, Kanagawa (JP); Hiromichi Takaoka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 142 days.

(21) Appl. No.: 12/938,662

(22) Filed: Nov. 3, 2010

(65) Prior Publication Data
US 2011/0108923 A1 May 12, 2011

(30) Foreign Application Priority Data

Nov. 6, 2009 (JP) .................................. 2009-255379

(51) Int. Cl.
*H01L 21/336* (2006.01)
(52) U.S. Cl.
USPC ................ 257/530; 257/369; 257/E23.147; 438/131; 438/302
(58) Field of Classification Search
USPC ................ 257/369, 530, E23.147; 438/131, 438/302
See application file for complete search history.

(56) References Cited

U.S. PATENT DOCUMENTS

| 5,691,562 | A | * | 11/1997 | Chen et al. | 257/391 |
| 5,733,792 | A | | 3/1998 | Masuoka | |
| 6,248,623 | B1 | * | 6/2001 | Chien et al. | 438/241 |
| 7,277,347 | B2 | | 10/2007 | Jenne | |
| 7,429,775 | B1 | * | 9/2008 | Nayak et al. | 257/369 |
| 7,790,517 | B2 | | 9/2010 | Manabe et al. | |
| 2004/0051162 | A1 | | 3/2004 | Chidambarrao et al. | |
| 2004/0232446 | A1 | * | 11/2004 | Nishimura et al. | 257/202 |
| 2005/0128787 | A1 | * | 6/2005 | Mouli | 365/149 |
| 2008/0090363 | A1 | | 4/2008 | Manabe et al. | |
| 2009/0029541 | A1 | * | 1/2009 | Chang et al. | 438/600 |

FOREIGN PATENT DOCUMENTS

| JP | 2004-111957 | 4/2004 |
| JP | 2008-098466 | 4/2008 |

OTHER PUBLICATIONS

Bonnie E. Weir et al., "Gate Dielectric Breakdown: A Focus on ESD Protection", 2004 IEEE International Reliability Physics Symposium Proceedings 42nd Annual, Apr. 25-29, 2004.

* cited by examiner

*Primary Examiner* — John C Ingham
(74) *Attorney, Agent, or Firm* — Young & Thompson (57) ABSTRACT

A semiconductor device has a conventional NMOS transistor and an NMOS transistor functioning as an anti-fuse element and having an n type channel region. The conventional NMOS transistor is equipped with an n type extension region and a p type pocket region, while the anti-fuse element is not equipped with an extension region and a pocket region. This makes it possible to improve the performance of the transistor and at the same time improve the characteristics of the anti-fuse element after breakdown of its gate dielectric film.

5 Claims, 11 Drawing Sheets

SEMICONDUCTOR DEVICE HAVING AN ANTI-FUSE ELEMENT AND A TRANSISTOR WITH A POCKET REGION

CROSS-REFERENCE TO RELATED APPLICATIONS

The disclosure of Japanese patent Application No. 2009-255379 filed on Nov. 6, 2009 including the specification drawings and abstract is incorporated herein by reference in its entirety.

BACKGROUND OF THE INVENTION

1. Field of the Invention

The present invention relates to a semiconductor device and a manufacturing method of the device, in particular, a semiconductor device having an anti-fuse element and a manufacturing method of the device.

2. Description of Related Art

Anti-fuse elements that operate on a principle of gate dielectric film breakdown are known as an element for writing data. Such anti-fuse elements operate when a voltage is applied to a gate electrode, which causes a gate dielectric film to break down so that conduction between the gate electrode and the source/drain can occur, thereby performing writing of data.

U.S. Pat. No. 7,277,347 discloses an NMOS structure formed in an N well as an anti-fuse.

Japanese Patent Laid-Open No. 2008-98466 describes a method of simultaneously forming N⁻ diffusion layer regions, which will be source/drain regions of a trench type transistor, and an N⁻ diffusion layer region, which will be a channel region, immediately below the gate of an anti-fuse. According to this document, formation of the N⁻ diffusion layer region immediately below the gate of an anti-fuse stabilizes electric coupling between the gate electrode and the source/drain diffusion layers even when writing data at a low writing voltage.

Japanese Patent Laid-Open No. 2004-111957 describes nitrogen implantation in the channel region of an anti-fuse. According to this document, this allows for a low writing voltage anti-fuse. Japanese Patent Laid-Open No. Hei 9(1997)-045906 discloses a MOS semiconductor device having a pocket structure.

SUMMARY OF THE INVENTION

The present inventors have discovered that when the gate dielectric film of an anti-fuse having an NMOS structure is broken, the filament that is thus formed between the gate electrode and the substrate will invariably act as the drain of a parasitic transistor.

This parasitic transistor has a short gate length so that hot carriers (hot electrons) are generated in the parasitic transistor. Generation of hot carriers in the parasitic transistor causes deterioration in properties, an increase in Vt of the parasitic transistor, and a decrease in an electric current passing through the filament. It therefore causes the anti-fuse device to malfunction.

The present inventors have studied the cause of such an increase in the Vt of the parasitic transistor. As a result, the present inventors have found that it occurs because electrons which have appeared with the generation of hot carriers are trapped in the sidewalls of the gate and retained in the sidewalls for a long period of time. Since the electrons are trapped in the gate sidewalls, even an application of a voltage to the gate electrode makes it difficult to form a channel below the gate electrode, causing an increase in the Vt of the parasitic transistor.

In the invention, there is provided a semiconductor device including:

an anti-fuse element formed in a first region, including:
a substrate;
a gate having:
a gate dielectric film formed over the substrate;
a gate electrode over the gate dielectric film; and
sidewalls formed on both sides of the gate electrode, respectively;
a source region and a drain region of a first conductivity type formed on both sides of the gate, respectively; and
a channel region of the first conductivity type formed between the source region and the drain region and delimited by those regions; and
a first transistor formed in a second region, including:
a gate having:
a gate dielectric film formed over the substrate;
a gate electrode over the gate dielectric film; and
sidewalls formed on both sides of the gate electrode, respectively;
a source region and a drain region of a first conductivity type formed on both sides of the gate electrode, respectively;
a channel region of a second conductivity type formed between the source region and the drain region; and
pocket regions of a second conductivity type formed respectively between the channel region of the second conductivity type and the source region and the drain region of the first conductivity type.

In the invention, there is also provided a manufacturing method of the semiconductor device, which includes the steps of:

implanting an dopant of the first conductivity type, while shielding the second region with a mask, to form the channel region of the anti-fuse element;

implanting an dopant of the second conductivity type in the second region to form the channel region of the first transistor;

forming, in the first region and the second region, the gate of the anti-fuse element and the first transistor, respectively;

implanting an dopant of the second conductivity type in the second region, while shielding the first region with a mask, to form the pocket regions of the second conductivity type;

after forming the pocket regions, forming the sidewalls of the gate of the anti-fuse element and the first transistor; and after forming the sidewalls, implanting an dopant of the first conductivity type to form the source region and the drain region of the anti-fuse element and the first transistor.

According to the construction described above, between the source region and the drain region, a channel region having the same conductivity type as that of those regions is formed in the anti-fuse element. Even if electrons are trapped in the gate sidewalls, this construction makes it possible to pass an electric current stably between the filament and the source/drain regions. As a result, an increase in the Vt of the parasitic transistor has less influence on the element. When a voltage is applied to the gate electrode, therefore, the parasitic transistor is turned ON and the electrically coupled state of the gate electrode and the channel region can be maintained. After breakdown of the gate dielectric film, an electric current can be applied stably, leading to an improvement in reliability. This means that the program state to the anti-fuse element can be read out smoothly.

In addition, the present inventors have found that in order to stably pass an electric current between the filament and the source/drain regions, it is desirable not only to form, between the source region and the drain region, a channel region having the same conductivity type with that of those regions but also to ensure that the channel region has a sufficient depth. Particularly in a region below the sidewalls, an electric current does not flow smoothly due to the influence of electrons trapped in the sidewalls on the surface side of the substrate so that an electric current is passed less efficiently between the source region and the drain region if the channel region has not been formed to a sufficient depth.

In conventional transistors, it is known to provide, between the source region and the drain region thereof, an extension region having the same conductivity type as that of these regions and a pocket region of a conductivity type opposite thereto, each having a depth less than that of the source/drain regions, in order to suppress a short channel effect, thereby keeping the performance of the transistor high. The extension region and the pocket region have conductivity types opposite to each other. As will be described later, the extension region and the pocket region are formed in one lithography step. In anti-fuse elements in which an extension region of the first conductivity type is formed in a manner similar to that of the first transistor, a pocket region of the second conductivity type, which is opposite to the first conductivity type, is formed in the channel region. Formation in the channel region of an impurity diffusion region having a conductivity type opposite thereto decreases the depth of the channel region, which creates a high resistance portion when a current flows between the filament and the source/drain regions. Such a region increases the Vt of the parasitic transistor, due to the influence of the electrons trapped in the sidewalls, leading to a marked increase in the failure ratio of the anti-fuse device.

According to the invention, the first transistor is equipped with the extension region and the pocket region, which contributes to the improvement in the performance, while the anti-fuse element is formed without the extension region and the pocket region so that the depth of the channel region between the source region and the drain region of the anti-fuse element can be made substantially constant over the whole region. In such an anti-fuse element, therefore, an electric current can be passed efficiently between the filament and the source/drain regions.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 12A:
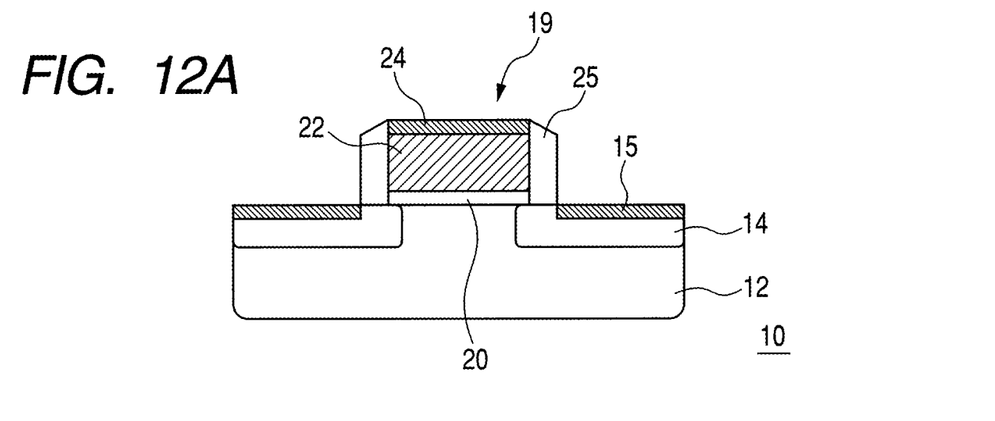
FIGS. 12(a), 12(b), and 12(c) show a conventional anti-fuse element, and illustrate the above-described undesired phenomena therein discovered by the present inventors.
Figure 12B:
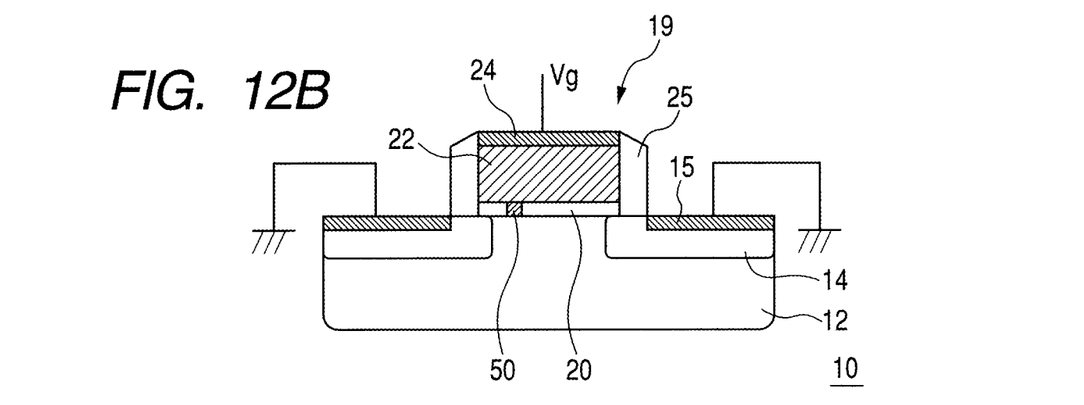
Figure 12C:
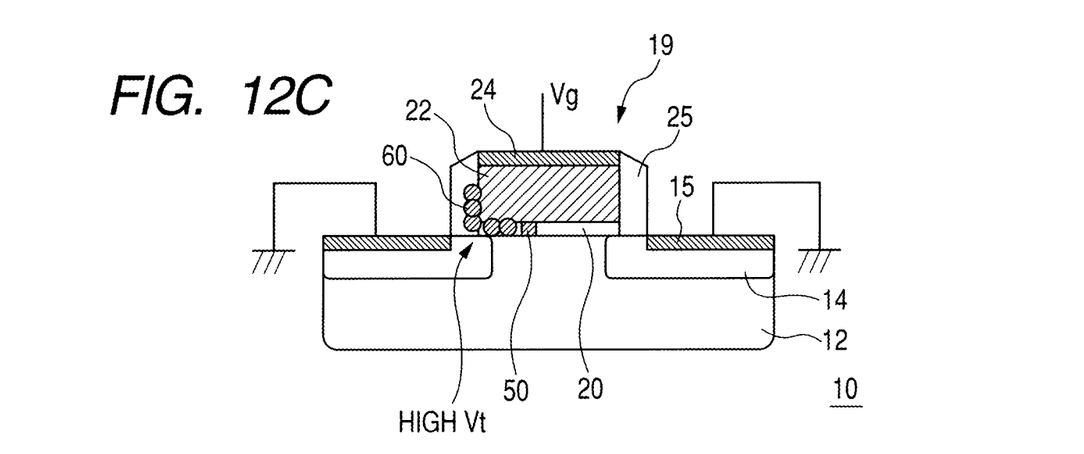

In FIGS. 12(a), (b), and (c) a semiconductor device 10 uses an NMOS transistor as an anti-fuse, with FIG. 12(a) being before breakdown of a gate dielectric film and FIGS. 12(b) and 12(c) being after breakdown of the gate dielectric film.

As illustrated in FIG. 12(a), the semiconductor device 10 has a p well 12, source/drain regions 14 formed in the surface of the p well 12, and a gate 19 formed over the p well 12. The gate 19 has a gate dielectric film 20, a gate electrode 22, a silicide layer 24 formed over the surface of the gate electrode 22, and sidewalls 25 formed on both sides of the gate electrode 22. Silicide layer 15 is also formed in the surfaces of the source/drain regions 14.

As illustrated in FIG. 12(b), when a predetermined voltage Vg is applied to the gate electrode 22 while connecting the source/drain regions 14 to ground, the gate dielectric film 20 is broken and a filament 50 is formed in the gate dielectric film 20. The gate electrode 22 is then electrically coupled to the p well 12 via the filament 50.

When the filament 50 is formed in such a manner, however, the filament 50 functions as if a drain and a parasitic transistor had been formed between the source/drain regions 14. In this parasitic transistor, the filament 50 which functions as a drain is short-circuited with the gate electrode 22, leading to application of a high voltage Vg.

This state is illustrated in FIG. 12(c), in which electrons 60 are shown as being retained in the sidewall 25. Since the electrons 60 are trapped in the sidewall 25, it is difficult to form a channel below the gate electrode 22 even when a voltage is applied to the gate electrode 22, thereby causing an increase in the Vt of the parasitic transistor.

Figure 1:
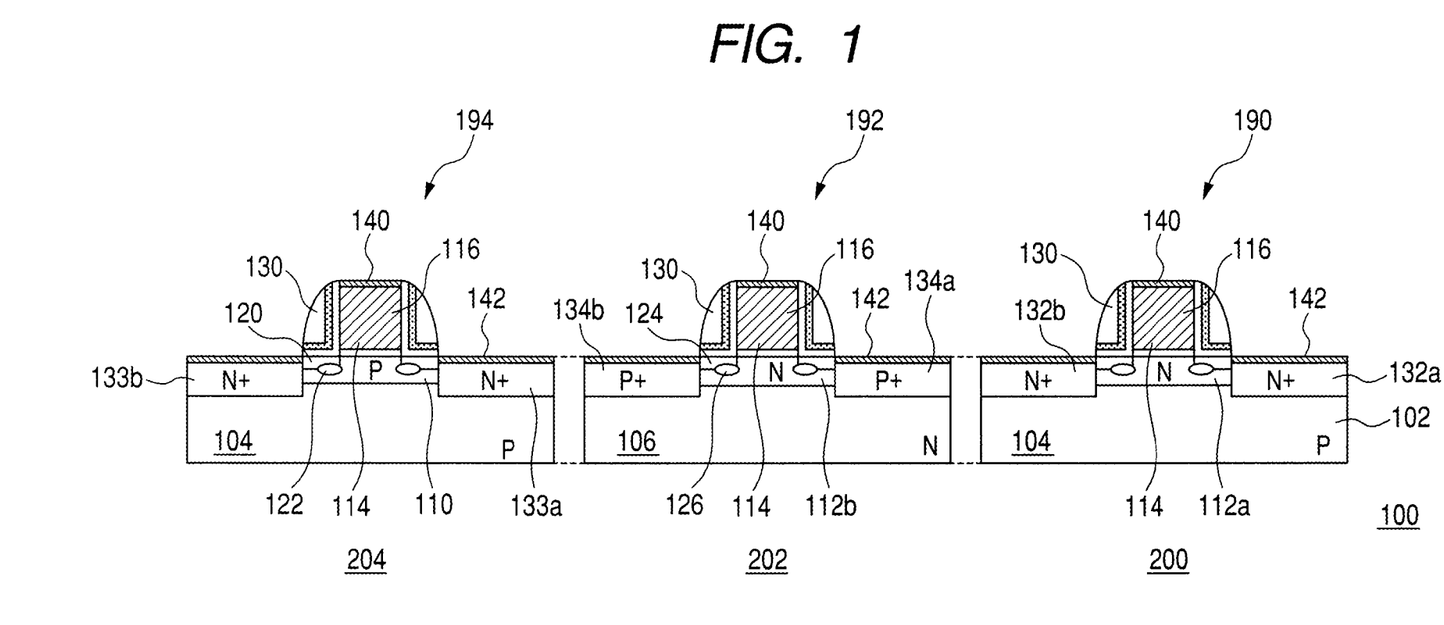
FIG. 1 is a cross-sectional view of a first embodiment of a semiconductor device according to the invention.

In FIG. 1, a semiconductor device 100 according to a first embodiment of the present invention has a substrate 102, an anti-fuse formation region 200 (first region), a PMOS formation region 202 (third region), and an NMOS formation region 204 (second region), each formed over the substrate 102. In the anti-fuse formation region 200, an anti-fuse element 190 is formed. In the PMOS formation region 202, a PMOS transistor 192 (second transistor) is formed. In the NMOS formation region 204, an NMOS transistor 194 (first transistor) is formed. The PMOS transistor 192 and the NMOS transistor 194 can configure a CMOS (Complementary Metal Oxide Semiconductor). In the present embodiment, the anti-fuse element 190 is formed, in the essential CMOS manufacturing step, simultaneously with the PMOS transistor 192 and the NMOS transistor 194 configuring the CMOS.

The anti-fuse element 190 has a p well 104 formed in the substrate 102, a gate formed over the p well 104, an n type channel region 112a formed in the surface of the P well 104 below the gate, and an n type source region 132a and an n type drain region 132b formed in the surface of the p well 104 on both sides of the n channel region 112a respectively. The gate has a gate dielectric film 114, a gate electrode 116, a silicide layer 140 formed on the surface of the gate electrode 116, and sidewalls 130 formed on both sides of the gate electrode 116. A silicide layer 142 can be formed over the surface of each of the n type source region 132a and the n type drain region 132b.

The PMOS transistor 192 has an n well 106 formed in the substrate 102, a gate formed over the n well 106, an n type channel region 112b formed in the surface of the n well 106 below the gate and functioning as a threshold controlling region, and a p type source region 134a and a p type drain region 134b formed in the surface of the n well 106 on both sides of the n type channel region 112b, respectively. The gate has a gate dielectric film 114, a gate electrode 116, a silicide layer 140 formed on the surface of the gate electrode 116, and sidewalls 130 formed on both sides of the gate electrode 116. A silicide layer 142 may be formed on the surface of each of the p type source region 134a and the p type drain region 134b.

The PMOS transistor 192 further has a p type extension region 124 formed in the surface of the n type channel region 112b below the sidewalls 130. The p type extension region 124 can be formed as a p type impurity diffusion region similar to the p type source region 134a and the p type drain region 134b. The PMOS transistor 192 further has, in the n type channel region 112b, an n type pocket region 126 at the angular portion of the p type extension region 124 contiguous to the n type channel region 112b. The n type pocket region 126 can be formed as an n type impurity diffusion region having a conductivity type opposite to that of the p type source region 134a and the p type drain region 134b.

The NMOS transistor 194 has a p well 104 formed in the substrate 102, a gate formed over the p well 104, a p type channel region 110 formed in the surface of the P well 104 below the gate and functioning as a threshold controlling region, and an n type source region 133a and an n type drain region 133b formed in the surface of the p well 104 on both sides of the p type channel region 110 respectively. The gate has a gate dielectric film 114, a gate electrode 116, a silicide layer 140 formed on the surface of the gate electrode 116, and sidewalls 130 formed on both sides of the gate electrode 116. A silicide layer 142 may be formed on the surface of each of the n type source region 133a and the N type drain region 133b.

The NMOS transistor 194 further has an n type extension region 120 formed in the surface of the p type channel region 110 below the sidewalls 130. The n type extension region 120 can be formed as an n type impurity diffusion region similar to the n type source region 133a and the n type drain region 133b. The NMOS transistor 194 further has, in the p type channel region 110, a P type pocket region 122 at the angular portion of the n type extension region 120 contiguous to the p type channel region 110. The p type pocket region 122 can be formed as a p type impurity diffusion region having a conductivity type opposite to that of the n type source region 133a and the n type drain region 133b.

In the present embodiment, the anti-fuse element 190 can be formed as an NMOS transistor similar to the NMOS transistor 194, but they are different from each other in the following respects:

(1) In the anti-fuse element 190, the channel region has a conductivity type the same as that of the source/drain regions. This means that in the NMOS transistor 194, the n type source region 133a and the n type drain region 133b have therebetween the p type channel region 110, while in the anti-fuse element 190, the n type source region 132a and the n type drain region 132b have therebetween the n type channel region 112a.

(2) The anti-fuse element 190 is not equipped with the extension region and the pocket region. This means that the NMOS transistor 194 is equipped with the n type extension region 120 and the p type pocket region 122. By providing the transistor with the extension region and the pocket region, a short-channel effect is suppressed and thus, the performance of the transistor can be kept high. It is therefore common practice to provide a transistor configuring CMOS with an extension region and a pocket region. In the present embodiment, therefore, the PMOS transistor 192 is equipped with the p type extension region 124 and the n type pocket region 126 also in the present embodiment. On the other hand, the anti-fuse element 190 is not equipped with such an extension region or pocket region.

The operation and advantages of this design of anti-fuse element 190 will now be described.

Figure 9A:
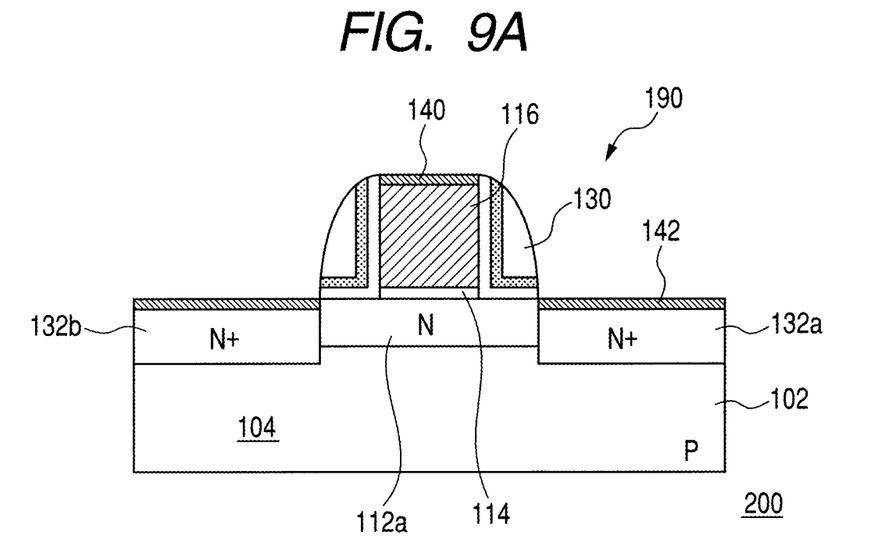
FIGS. 9(a) and (b) are cross-sectional views illustrating the construction of an anti-fuse element of the embodiment of FIG. 1.
Figure 9B:
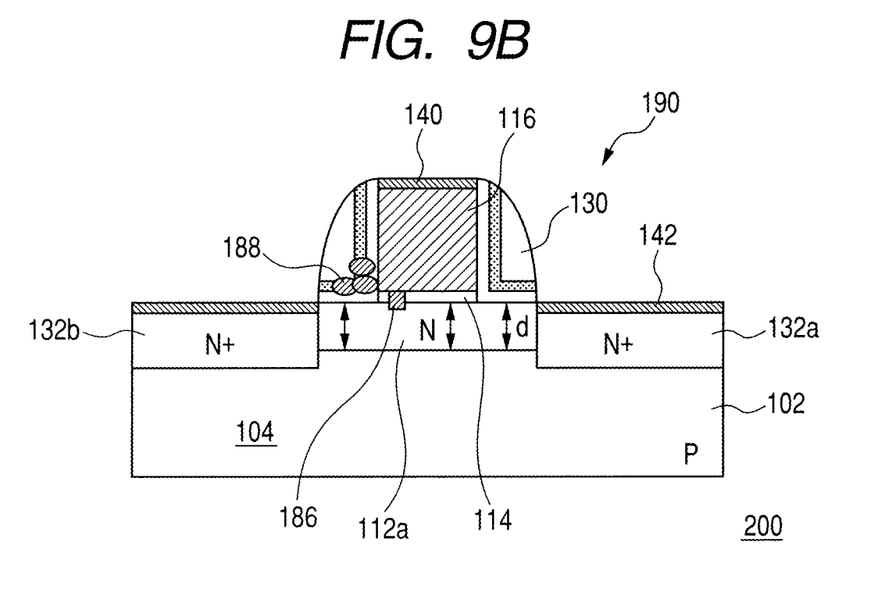

FIG. 9(a) shows the anti-fuse element 190 before breakdown of the gate dielectric film 114, and FIG. 9(b) shows it after breakdown of the gate dielectric film 114.

In FIG. 9(a), a predetermined voltage is applied to the gate electrode 116 while connecting each of the n type source region 132a and the n type drain region 132b to ground. The applied voltage breaks the gate dielectric film 114 and a filament 186 is formed in the gate dielectric film 114, as shown in FIG. 9(b).

As a result, the gate electrode 116 is electrically coupled to the n type channel region 112a via the filament 186. At this time, as described above, the filament 186 functions as a drain of a parasitic transistor formed between the n type source region 132a and the n type drain region 132b. Hot carriers (hot electrons) are generated in the parasitic transistor and as described with reference to FIG. 12(c), electrons 188 are trapped in the sidewalls 130.

In the present embodiment, however, the channel region 112a is of the n type, and is formed between the n type source region 132a and the n type drain region 132b. Thus, even if electrons 188 are trapped in the sidewalls 130, an electric current can be passed stably between the filament 186 and the n type source region 132a and the filament 186 and the n type drain region 132b, thereby reducing the influence of an increase in Vt of the parasitic transistor.

When a voltage is applied to the gate electrode 116, the parasitic transistor is turned ON, making it possible to keep good electrical coupling between the gate electrode 116 and the n type channel region 112a. An electric current can therefore be passed stably after breakdown of the gate dielectric film 114, so that reliability can be improved. This means that the writing state of the anti-fuse element can be read out well.

In addition, the inventors have found that in order to pass an electric current stably between the filament 186 and the N type source region 132a and the filament 186 and the n type drain region 132b, it is desirable not only to form an n type channel region between the n type source region 132a and the n type drain region 132b but also to form the n type channel region 112a to a sufficient depth. Due to the influence of the electrons 188 trapped in the sidewalls 130, smooth flow of an electric current is disturbed particularly in a region below the sidewalls 130 on the surface side of the substrate 102. When the n type channel region does not have a sufficient depth, an electric current cannot be passed as efficiently between the filament 186 and the n type source region 132a and the filament 186 and the n type drain region 132b. More particularly, the n type channel region 112a in the portions below the sidewalls 130 should have a depth that is at least about the same as that of the other portions of the channel region, to ensure that an electric current can be passed efficiently between the filament 186 and the n type source region 132a and the filament 186 and the n type drain region 132b.

Figure 10:
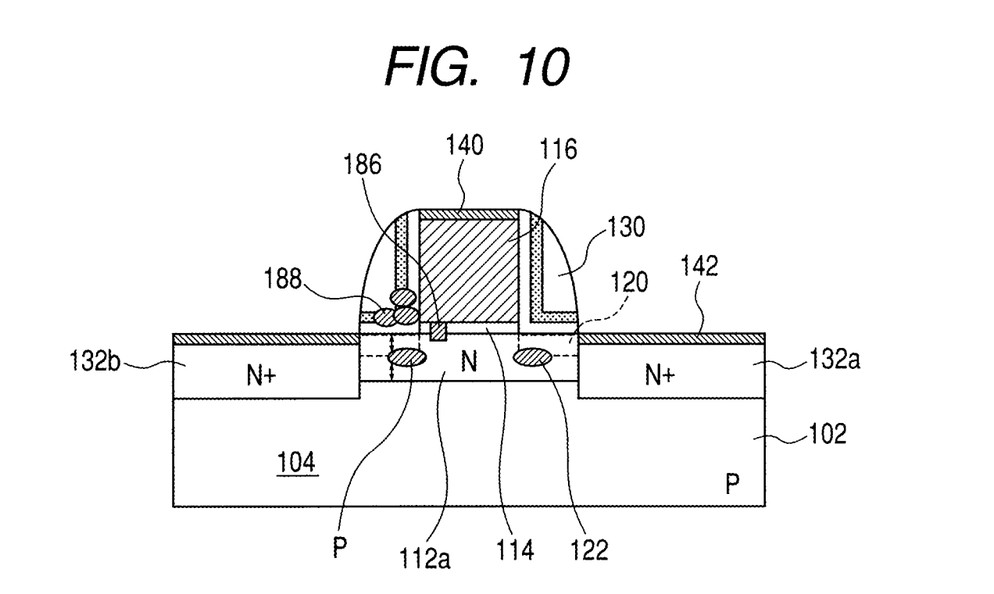
FIG. 10 illustrates the problems that occur when an anti-fuse element is equipped with an extension region and a pocket region.

The extension region of the MOS has a conductivity type the same as that of the source region and the drain region, whereas the pocket region has a conductivity type opposite to that of the extension region. As described later, the extension region and the pocket region of the CMOS are formed simultaneously. For example, if an n type extension region were formed in the anti-fuse element 190 as in the NMOS transistor 194, a p type pocket region, which has a conductivity type opposite to n type, would also be formed in the n channel region 112a. FIG. 10 shows the problems that occur when an anti-fuse element is equipped with an n type extension region 120 and a p type pocket region 122 as in the NMOS transistor 194. In such a construction, the n type channel region 112a has therein the n type pocket region 122 having a conductivity type opposite thereto, which decreases the depth of the n type channel region 112a. More particularly, the n type channel region 112a is shallower in the portions thereof below the sidewalls 130.

Figure 11:
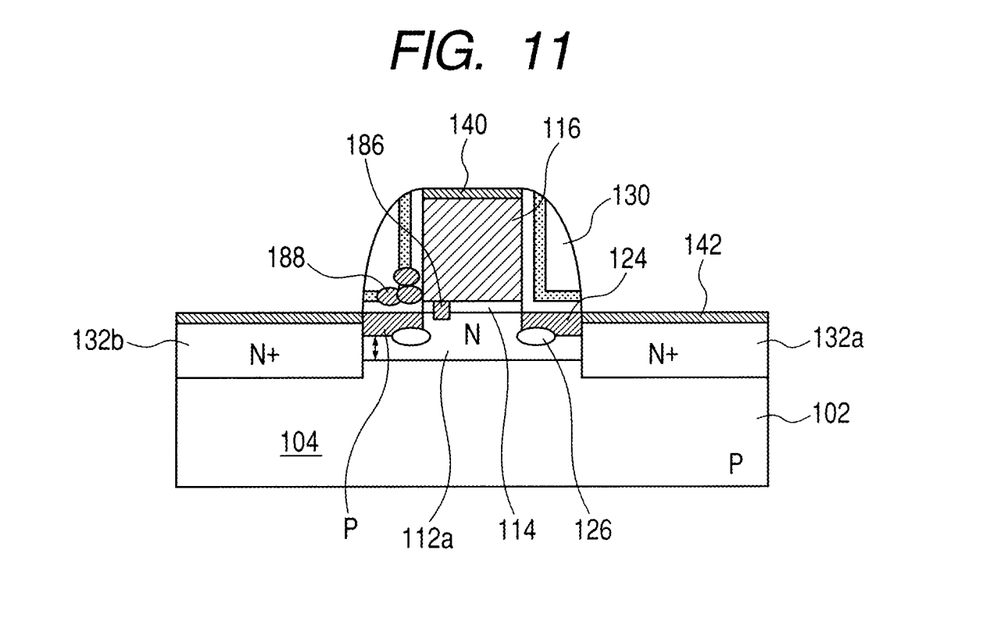
FIG. 11 further illustrates the problems that occur when an anti-fuse element is equipped with an extension region and a pocket region.

When the anti-fuse formation region 200 is not shielded during formation of the p type extension region 124 and the n type pocket region 126 of the PMOS transistor 192, a p type extension region, which has a conductivity type opposite to the n type channel region 112a, will be formed therein. FIG. 11 shows the problems that arise when the p type extension region 124 and the n type pocket region 126 are formed in the anti-fuse element 190 as in the PMOS transistor 192. In such a construction, the n type channel region 112a has therein the p type extension region 124 having a conductivity type opposite thereto and it decreases the depth of the n type channel region 112a, particularly below the sidewalls 130.

When an impurity diffusion region having a conductivity type opposite to that of the n type channel region 112a is formed therein, the width of the n type channel region 112a inevitably decreases in proportion in the depth direction and a high resistance portion appears between the n type source region 132a and the n type drain region 132b when an electric current flows therebetween. Presence of such a region increases the Vt of the parasitic transistor due to the influence of the electrons 188 trapped in the sidewalls 130, leading to a marked increase in the failure ratio of the device as an anti-fuse device.

In the present embodiment, therefore, the anti-fuse element 190 is not equipped with an extension region and a pocket region. As illustrated in FIG. 9(b), such a constitution enables to make the depth d of the N type channel region 112a between the N type source region 132a and the N type drain region 132b substantially equal throughout the region. In the present embodiment, with respect to the N type channel region 112a of the anti-fuse element 190, a region below the sidewalls 130 can be made substantially equal to that of a region below the gate electrode 116. Since the N type channel region 112a below the sidewalls 130 has a depth almost equally deep to that of the other region, even if electrons are trapped in the sidewalls 130, the element is not susceptible to the influence of an increase in Vt. The depth d of the N type channel region 112a can be set at, for example, 0.3 µm or greater, more preferably 0.5 µm or greater. The concentration of the N type channel region 112a can be set at, for example, from 1e18 to 2e19 atoms/cm$^3$. As will be described later, the N type channel region 112a can be formed simultaneously with the N type channel region 112b of the PMOS transistor 192.

According to the technology described in Japanese Patent Laid-Open No. 2008-98466, an N$^-$ diffusion layer region having the same conductivity type as that of the source region and the drain region is provided below the gate of the anti-fuse. This document however does not include the recognition about the trapping of electrons in sidewalls, which is a problem to be solved in the present invention. There is therefore no difference between the anti-fuse and the conventional transistor in the presence or absence of the extension region and the pocket region. The constitution described in this document is therefore accompanied with the problem in improvement in the performance of the conventional transistor and smooth reading of the program state to the anti-fuse element.

According to the technology described in Japanese Patent Laid-Open No. 2008-98466, the N$^-$ diffusion layer region of the anti-fuse is formed by ion implantation through a gate electrode. By such a method, however, the concentration profile of the N$^-$ diffusion layer region becomes unstable and characteristics vary widely. It is therefore impossible to control the depth of the N$^-$ diffusion layer region to fall within a proper range. According to the invention, on the other hand, the channel region of the anti-fuse element is formed prior to the formation of the gate electrode so that the concentration and depth of the channel region can be controlled to fall within a desired proper range.

The manufacturing procedure of the semiconductor device 100 in the present embodiment will next be described. FIGS. 2 to 8 are cross-sectional views illustrating steps in the manufacturing procedure of the semiconductor device 100 in the present embodiment.

First, a substrate 102 is prepared and an anti-fuse formation region 200, a PMOS formation region 202, and an NMOS formation region 204 are isolated from each other by using an element isolation dielectric film (not illustrated). Then, a P type dopant 152 is implanted in the anti-fuse formation region 200 and the NMOS formation region 204 while selectively shielding the PMOS formation region 202 over the substrate 102 with a resist film 150. As a result, a P well 104 is formed in the anti-fuse formation region 200 and the NMOS formation region 204 (FIG. 2(a)).

The resist film 150 is then removed and a P type dopant 156 is implanted in the NMOS formation region 204 while selectively shielding the anti-fuse formation region 200 and the PMOS formation region 202 with a resist film 154. As a result, a P type channel region 110 functioning as a threshold controlling region is formed in the surface of the P well 104 in the NMOS formation region 204 (FIG. 2(b)). Although no particular limitation is imposed on the P type dopant concentration of the P type channel region 110, it can be set at, for example, about 2e18 atoms/cm$^3$.

Then, the resist film 154 is removed. An N type dopant 160 is implanted in the PMOS formation region 202 while selectively shielding the anti-fuse formation region 200 and the NMOS formation region 204 with a resist film 158. As a result, an N well 106 is formed in the PMOS formation region 202 (FIG. 3(a)).

Then, the resist film 158 is removed. An N type dopant 164 is implanted in the anti-fuse formation region 200 and the PMOS formation region 202 while selectively shielding the NMOS formation region 204 with a resist film 162. As a result, an N type channel region 112a and an N type channel region 112b are formed in the anti-fuse formation region 200 and the PMOS formation region 202, respectively (FIG. 3(b)). The N type channel region 112b functions as a threshold controlling region. Although no particular limitation is imposed on the N type dopant concentration of the N type channel region 112b and the N type channel region 112a, it can be set at, for example, from about 1e18 to 2e19 atoms/cm$^3$.

Figure 3A:
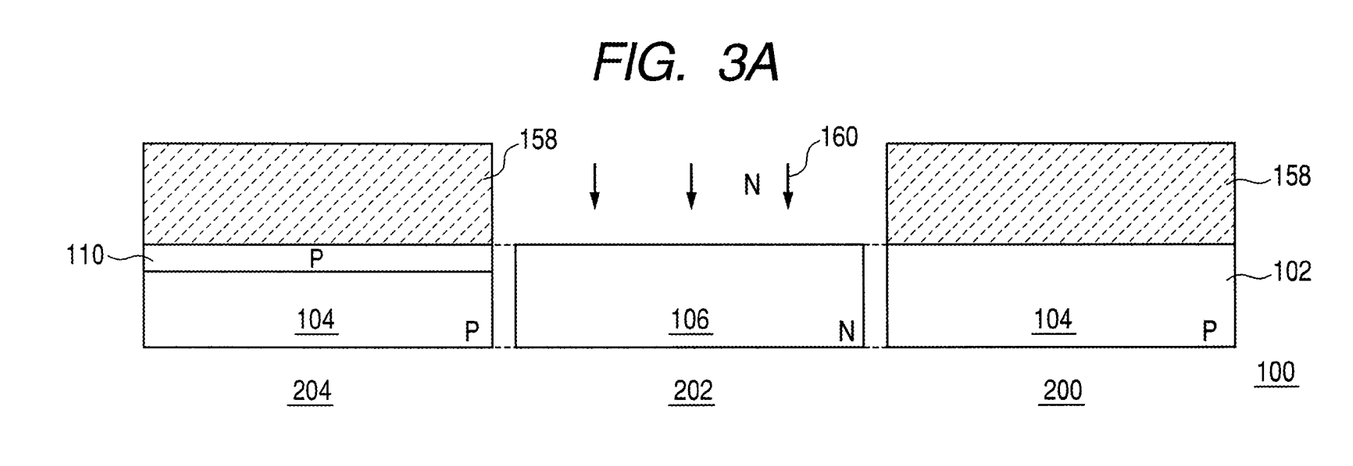
FIGS. 3(a) and 3(b) are cross-sectional views of subsequent steps in a manufacturing procedure of the embodiment of FIG. 1.
Figure 3B:
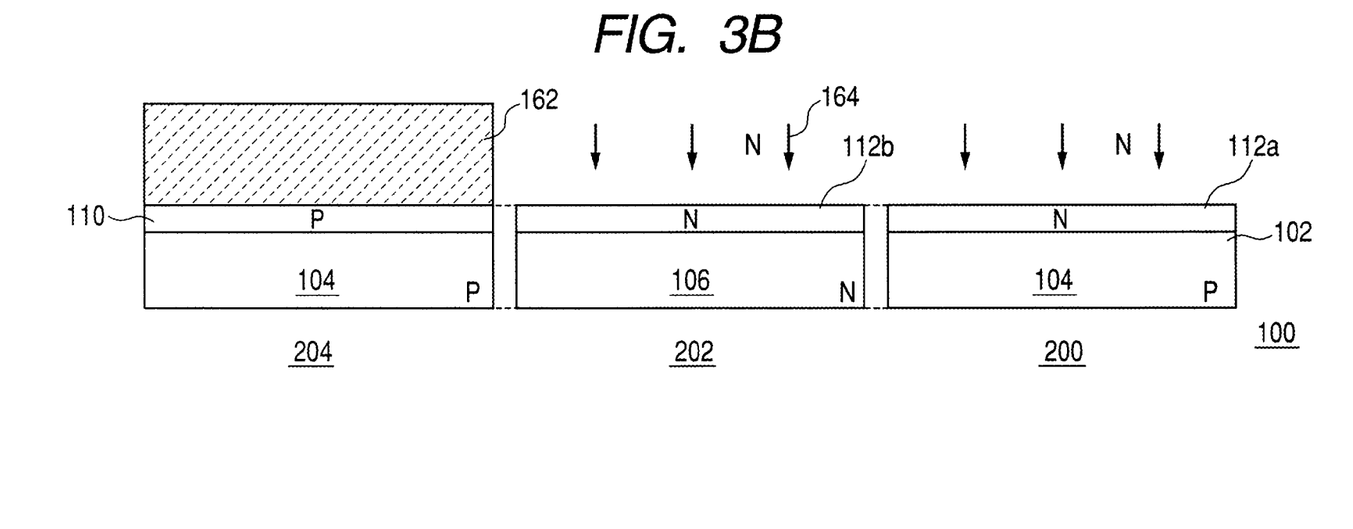
Figure 4A:
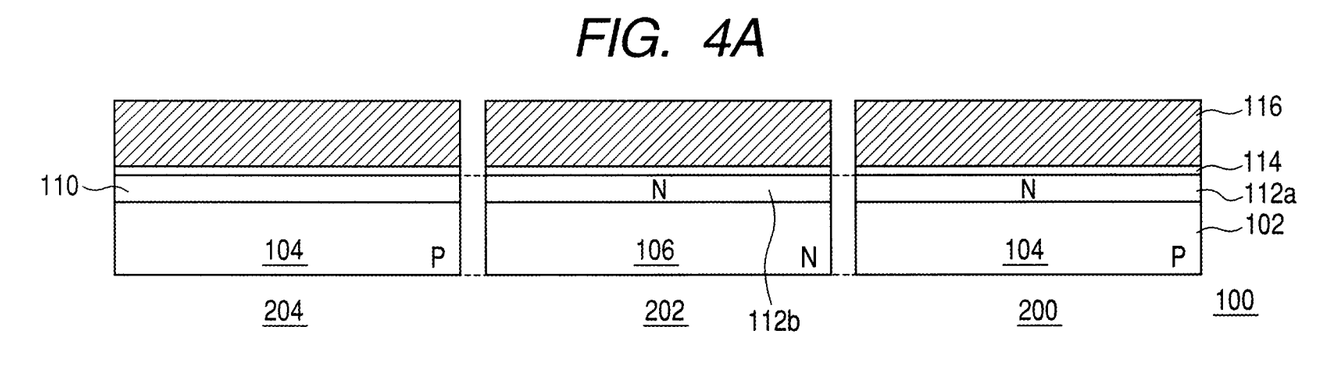
FIGS. 4(a) and 4(b) are cross-sectional views of further subsequent steps in a manufacturing procedure of the embodiment of FIG. 1.
Figure 4B:
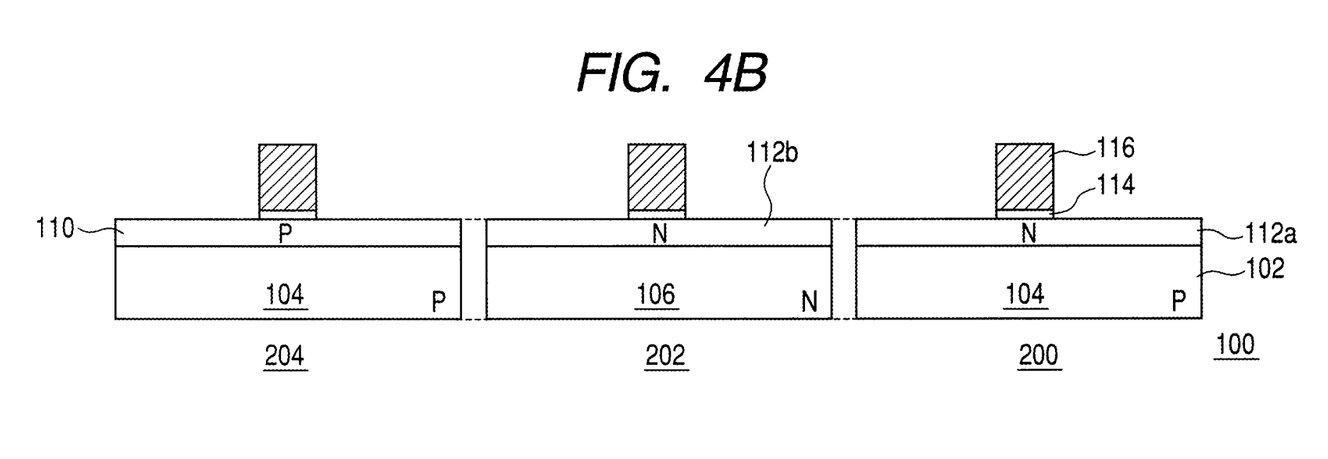

In the present embodiment, the N type channel region 112a can be formed simultaneously with the N type channel region 112b of the PMOS transistor 192 so that in the anti-fuse element 190, the N type channel region 112a can be formed without an additional step such as lithography step.

Figure 2A:
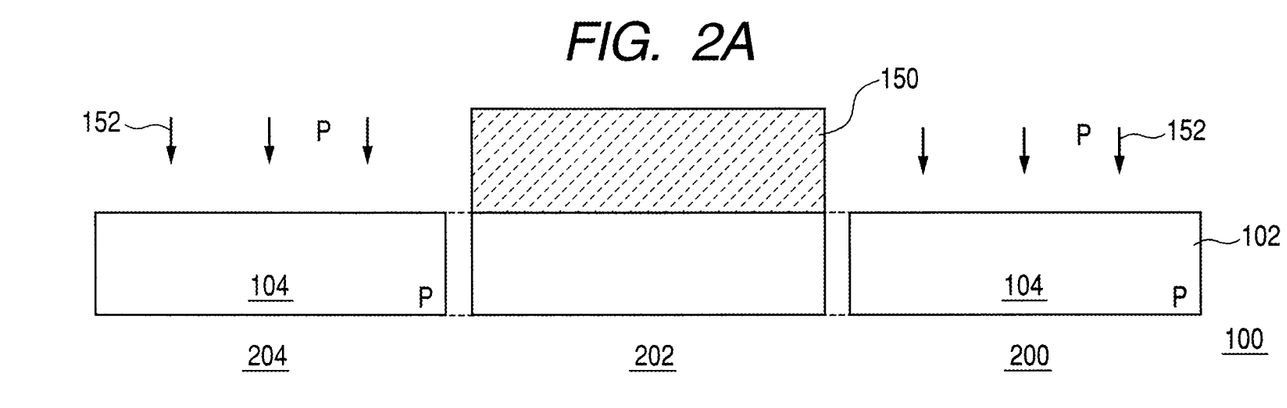
FIGS. 2(a) and 2(b) are cross-sectional views of steps in a manufacturing procedure of the embodiment of FIG. 1.
Figure 2B:
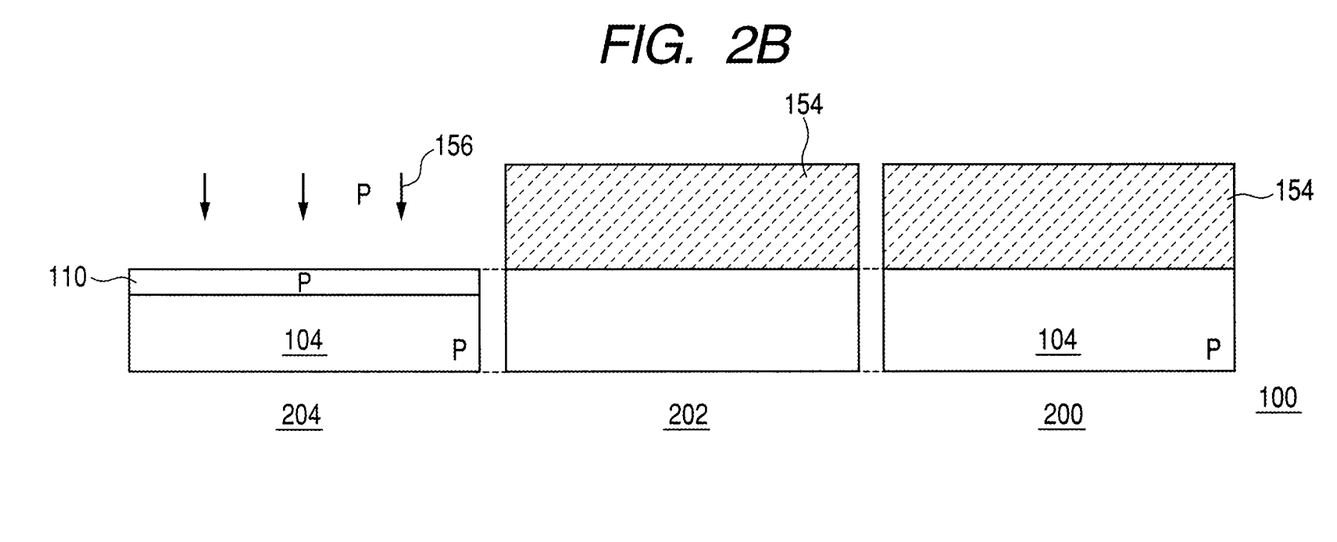

Alternatively, it is also possible to form a P type impurity diffusion region similar to the P type channel region 110 in the anti-fuse formation region 200 without shielding the anti-fuse formation region 200 with the resist film 154 when the P type dopant 156 is implanted in the NMOS formation region 204 to form the P type channel region 110 as illustrated in FIG. 2(b). In this case, in the implantation step of the N type dopant 164 in FIG. 3(b), it is only necessary to form the N type channel region 112a while setting the concentration of the N type dopant greater than that of the P type impurity diffusion region. In this case, although no particular limitation is imposed on the N type dopant concentration in the N type channel region 112a, it can be set at from about 4e18 to 2e19 atoms/cm$^3$.

The resist film 162 is then removed. A gate dielectric film 114 and a gate electrode 116 are then formed on the entire surface over the substrate 102 (FIG. 4(a)), followed by patterning of the gate electrode 116 and the gate dielectric film 114 into a predetermined gate shape (FIG. 4(b)).

Figure 5A:
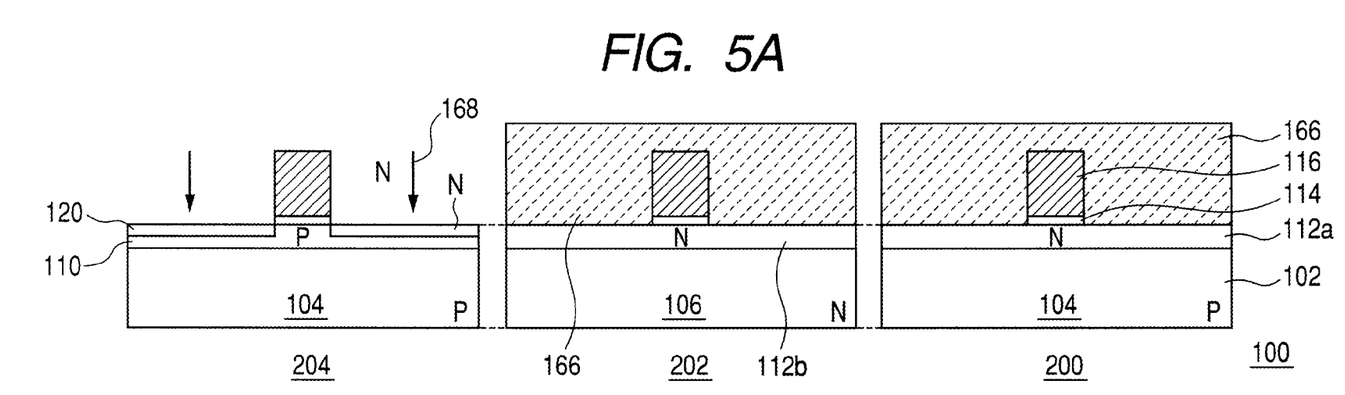
FIGS. 5(a) and 5(b) are cross-sectional views of further subsequent steps in a manufacturing procedure of the embodiment of FIG. 1.
Figure 5B:
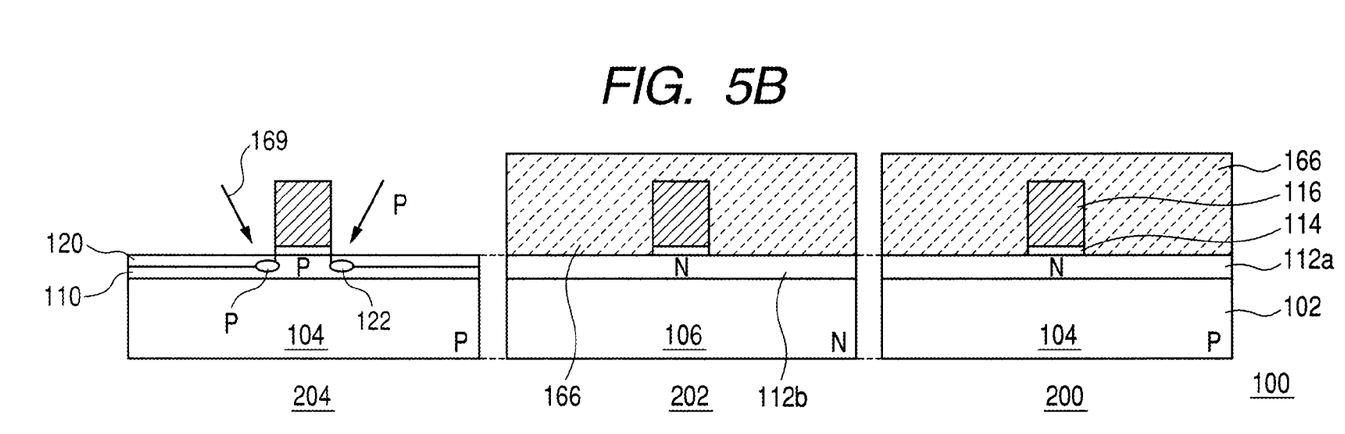

An N type dopant 168 is implanted in the NMOS formation region 204, while selectively shielding the anti-fuse formation region 200 and the PMOS formation region 202 with a resist film 166, to form an N type extension region 120 in the NMOS formation region 204 (FIG. 5(a)). A P type dopant 169 is then implanted in the NMOS formation region 204, while shielding the anti-fuse formation region 200 and the PMOS formation region 202 with the resist film 166, to form a P type pocket region 122 (FIG. 5(b)). The resist film 166 is then removed. Although no particular limitation is imposed on the N type dopant concentration in the N type extension region 120, it can be set at, for example, about 1e20 atoms/cm$^3$. Although no particular limitation is imposed on the P type dopant concentration in the P type pocket region 122, it can be set at, for example, about 5e19 atoms/cm$^3$.

Figure 6A:
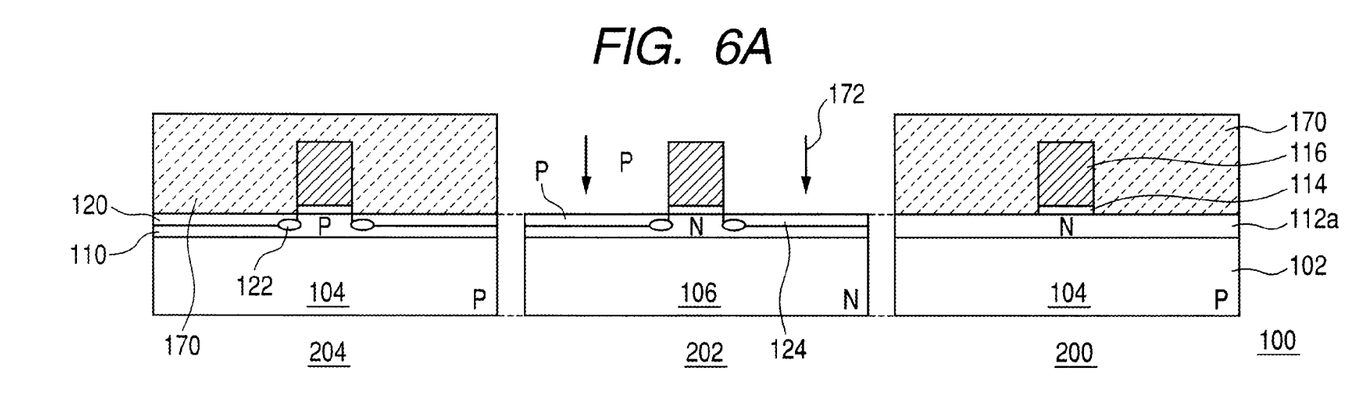
FIGS. 6(a) and 6(b) are cross-sectional views of further subsequent steps in a manufacturing procedure of the embodiment of FIG. 1.
Figure 6B:
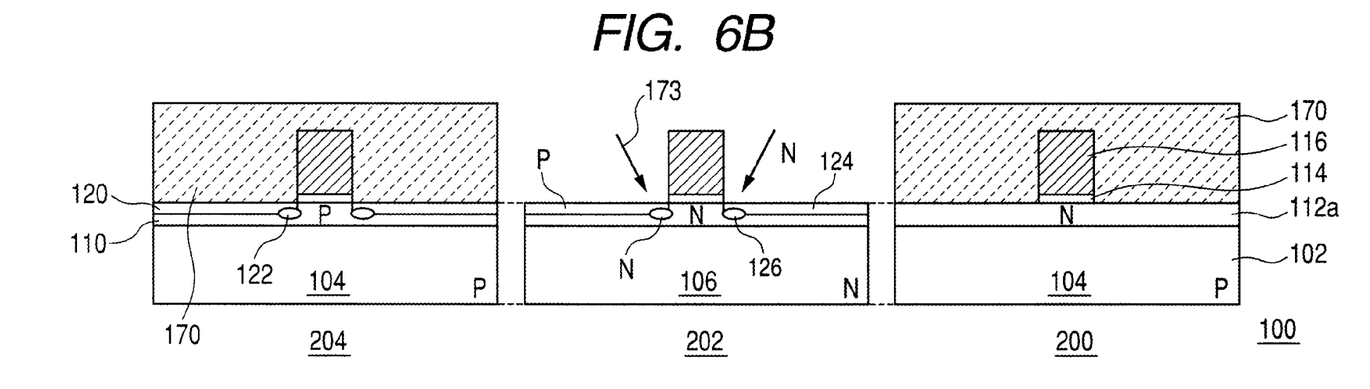

A P type dopant 172 is then implanted in the PMOS formation region 202, while selectively shielding the anti-fuse formation region 200 and the NMOS formation region 204 with a resist film 170, to form a P type extension region 124 in the PMOS formation region 202 (FIG. 6(a)). An N type dopant 173 is then implanted in the PMOS formation region 202, while shielding the anti-fuse formation region 200 and the NMOS formation region 204 with a resist film 170, to form an N type pocket region 126 (FIG. 6(b)). The resist film 170 is then removed. Although no particular limitation is imposed on the P type dopant concentration in the P type extension region 124, it can be set at, for example, about 1e20 atoms/cm$^3$. Although no particular limitation is imposed on the N type dopant concentration in the N type pocket region 126, it can be set at, for example, about 5e19 atoms/cm$^3$.

In the CMOS manufacturing steps, the N type extension region 120 and the P type pocket region 122 in the NMOS transistor 194 are formed successively while shielding the anti-fuse formation region 200 and the PMOS formation region 202 with the resist film 166. Similarly, the P type extension region 124 and the N type pocket region 126 in the PMOS transistor 192 are formed successively while shielding the anti-fuse formation region 200 and the NMOS formation region 204 with the resist film 170. In each step, both the N type dopant and the P type dopant are implanted in regions not shielded with these resist films.

For example, when the anti-fuse formation region 200 is not shielded with the resist film 166 when the N type extension region 120 and the P type pocket region 122 of the NMOS transistor 194 are formed, the anti-fuse element 190 inevitably has a constitution as illustrated in FIG. 10. In addition, when the anti-fuse formation region 200 is not shielded with the resist film 170 when the P type extension region 124 and the N type pocket region 126 of the PMOS transistor 192 are formed, the anti-fuse element 190 inevitably has a constitution as illustrated in FIG. 11.

On the other hand, when a resist film is formed whenever ion implantation for the formation of an extension region and ion implantation for the formation of a pocket region are performed, the number of steps becomes very large due to the lithography steps to be added.

In the present embodiment, upon formation of the extension region and the pocket region in each of the PMOS transistor 192 and the NMOS transistor 194, the anti-fuse formation region 200 is shielded with a resist film in order to prevent implantation of the P type dopant in the N type channel region 112a of the anti-fuse formation region 200. This makes it possible to form the N type channel region 112a having a desirable concentration and depth without adding a step typical to the essential CMOS manufacturing step.

Figure 7A:
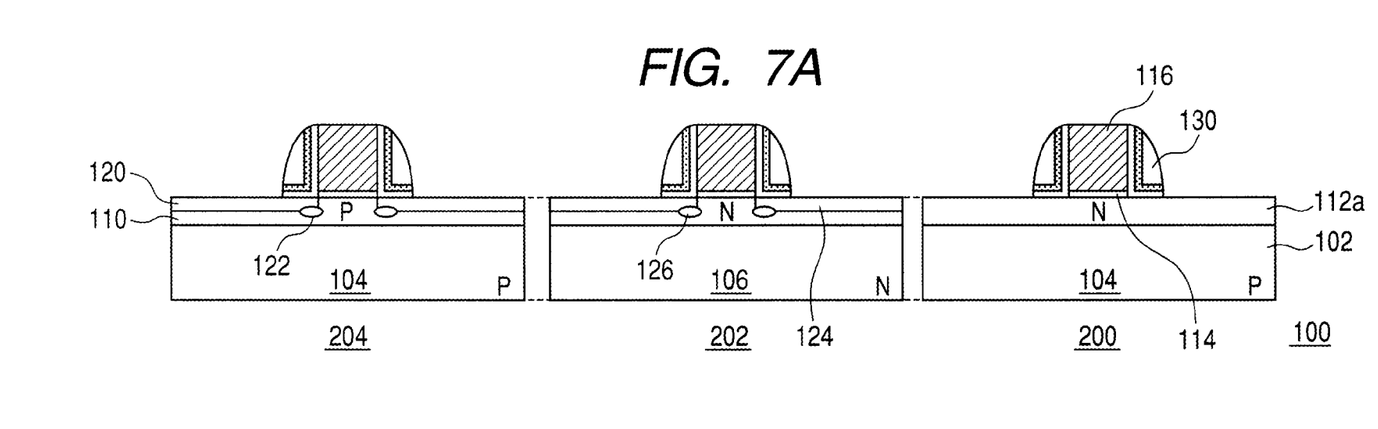
FIGS. 7(a) and 7(b) are cross-sectional views of further subsequent steps in a manufacturing procedure of the embodiment of FIG. 1.
Figure 7B:
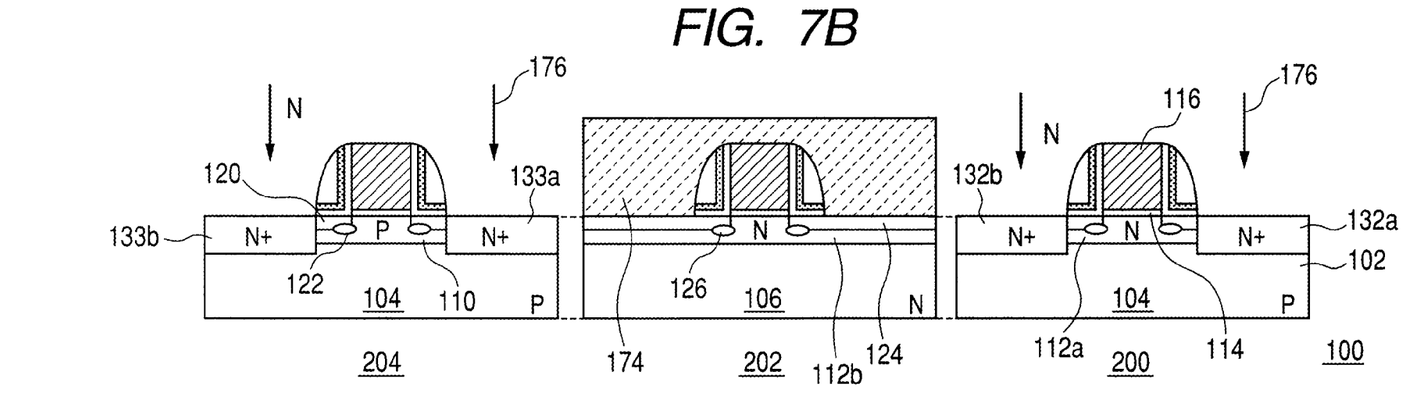

Then, a dielectric film configuring the sidewalls 130 is formed on the entire surface of the substrate 102, followed by etchback to form sidewalls 130 in the anti-fuse formation region 200, the PMOS formation region 202, and the NMOS formation region 204 (FIG. 7(a)). The sidewalls 130 may be a film stack obtained by stacking, for example, a silicon oxide film, a silicon nitride film, and a silicon oxide film one after another in the order of mention. When the sidewall 130 has the silicon nitride film, electrons are easily trapped in the silicon nitride film. The constitution of the anti-fuse element 190 in the present embodiment can therefore be used more effectively when the sidewall 130 contains therein a silicon nitride film. Even if the sidewall 130 does not contain a silicon nitride film, electrons are trapped in the dielectric film configuring the sidewall so that the advantage of the present embodiment can also be obtained by using the constitution of the anti-fuse element 190 even if the sidewall 130 does not contain a silicon nitride film.

An N type dopant 176 is implanted in the anti-fuse formation region 200 and the NMOS formation region 204, while selectively shielding the PMOS formation region 202 with a resist film 174, to form an N type source region 132a and an N type drain region 132b, and an N type source region 133a and an N type drain region 133b, respectively (FIG. 7b)). The resist film 174 is then removed. Although no particular limitation is imposed on the N-type dopant concentration of the N type source region 132a, the N type drain region 132b, the N type source region 133a, and the N type drain region 133b, it can be set at about 4e21 atoms/cm$^3$.

Figure 8A:
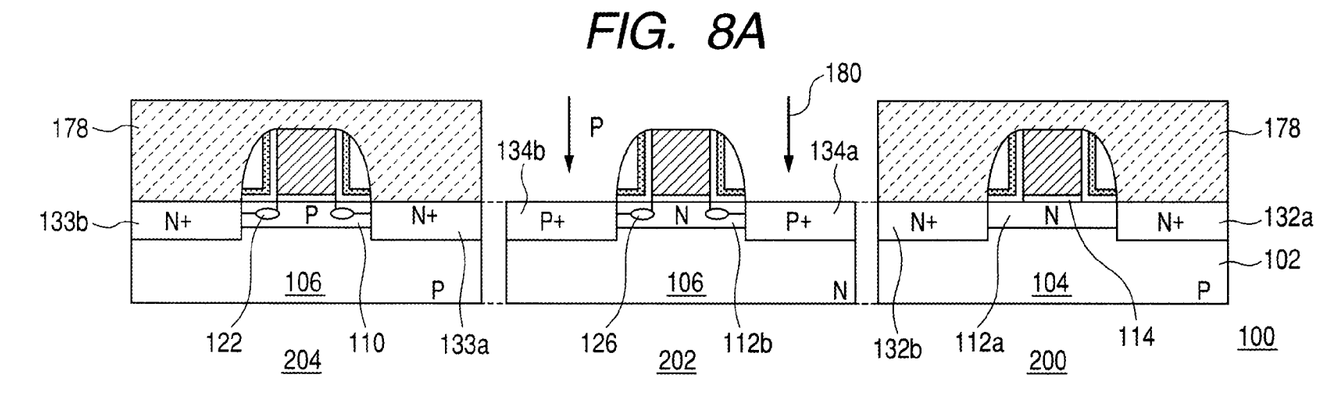
FIGS. 8(a) and 8(b) are cross-sectional views of further subsequent steps in a manufacturing procedure of the embodiment of FIG. 1.
Figure 8B:
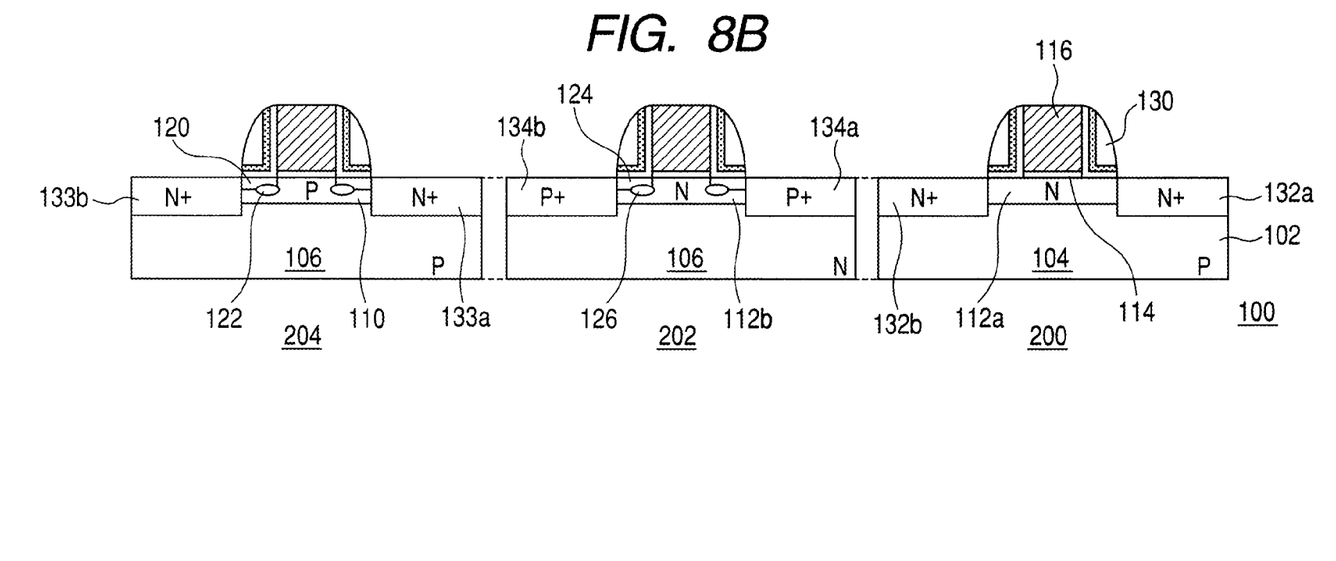

Then, a P type dopant 180 is implanted in the PMOS formation region 202, while selectively shielding the anti-fuse formation region 200 and the NMOS formation region 204 with a resist film 178, to form a P type source region 134a and a P type drain region 134b (FIG. 8(a)). The resist film 178 is then removed (FIG. 8(b)). Although no particular limitation is imposed on the P type dopant concentration of the P type source region 134a and the P type drain region 134b, it can be set at, for example, about 4e21 atoms/cm$^3$.

A metal film is then formed over the entire surface over the substrate 102 to form a silicide layer 142 and a silicide layer 140 over the surface of the substrate 102 and the surface of the gate electrode 116, respectively. As a result, the semiconductor device 100 having the constitution as illustrated in FIG. 1 can be obtained.

The order of the procedures described in the above embodiment can be changed as needed unless otherwise specifically indicated. For example, the P well 104 is formed prior to the N well 106 in the above embodiment, and may be vice versa. In addition, the P type channel region 110 is formed prior to the N type channel region 112a and the N type channel region 112b, and may be vice versa. Further, the N type extension region 120 and the P type pocket region 122 are formed prior to the P type extension region 124 and the N type pocket region 126, and may be vice versa. Furthermore, the N type source region 132a, the N type drain region 132b, the N type source region 133a, and the N type drain region 133b are formed prior to the P type source region 134a and the P type drain region 134b, and may be vice versa.

Thus, the anti-fuse element in the present embodiment can be manufactured simultaneously with the CMOS by using the essential CMOS manufacturing steps without an additional step. This makes it possible to manufacture an anti-fuse element having a high reliability without adding, to the CMOS manufacturing steps, a step typical to the manufacture of an anti-fuse element.

In consideration of the breakdown of a gate dielectric film at a lower voltage, a breakdown voltage necessary for breaking usually becomes higher by about from 0.5 to 1.5 V in PMOS than in NMOS because a tunnel leakage current is lower in PMOS than in NMOS (Bonnie E. Weir, "GATE DIELECTRIC BREAKDOWN: A FOCUS ON ESD PROTECTION", FIG. 3, 4, IRPS2004). The gate dielectric film of the anti-fuse element comprised of an NMOS transistor can therefore be broken at a lower voltage. When an anti-fuse element is formed of an NMOS transistor, on the other hand, an increase in Vt of the parasitic transistor due to generation of hot electrons as described above is likely to occur. According to the semiconductor device 100 of the present embodiment, even if an NMOS transistor is used as the anti-fuse element, trapping of electrons in the sidewalls can be prevented, the gate dielectric film can be broken at a lower voltage, and a program state to the anti-fuse element can be read out smoothly.

The embodiments of the present invention were described above referring to drawings, but they are exemplary only and various constitutions other than the above-described ones can be employed.

In the above embodiments, the anti-fuse element 190 comprised of NMOS was described as one example. As described above, when an anti-fuse element is comprised of an NMOS transistor, electrons are trapped in the sidewalls 130 so that the invention is greatly effective for overcoming this problem. Even an anti-fuse element comprised of a PMOS transistor, however, is not free from the influence of trapping of hot carriers in the sidewalls. The invention can be applied also to the anti-fuse element comprised of a PMOS transistor. In this case, the channel region of the anti-fuse element set to have a P conductivity type can be formed simultaneously with the channel region of NMOS.

What is claimed is:

1. A semiconductor device comprising:
a substrate;
an anti-fuse element formed in a first region of said substrate, said anti-fuse element comprising:
   a gate dielectric film formed over the substrate,
   a gate electrode over the gate dielectric film,
   sidewalls formed on both sides of the gate electrode, the sidewalls including a film stack of, in order, a silicon oxide film, a silicon nitride film, and a silicon oxide film,
   a source region and a drain region of a first conductivity type formed on respective sides of the gate electrode, and
   a channel region formed entirely of the first conductivity type and extending with a constant depth from the source region to the drain region without any regions of a second conductivity type in the channel region of said anti-fuse element; and
a first transistor formed in a second region of said substrate, said first transistor comprising:
   a gate dielectric film formed over the substrate,
   a gate electrode over the gate dielectric film,
   sidewalls formed on respective sides of the gate electrode,
   a source region and a drain region of the first conductivity type formed on respective sides of the gate electrode,
   a channel region of the second conductivity type formed between the source region and the drain region, and
   pocket regions of the second conductivity type formed respectively between the channel region of the second conductivity type and the source region and the drain region of the first transistor.

2. The semiconductor device according to claim 1, wherein the first transistor further comprises extension regions of the first conductivity type between the source region and the drain region of the first transistor and the pocket regions of the first transistor, respectively.

3. The semiconductor device according to claim 1, further comprising:
a second transistor formed in a third region of said substrate, said second transistor comprising:
   a gate dielectric film formed over the substrate,
   a gate electrode over the gate dielectric film,
   sidewalls formed on respective sides of the gate electrode,
   a source region and a drain region of the second conductivity type formed on respective sides of the gate electrode,
   a channel region of the first conductivity type formed between the source region and the drain region, and
   pocket regions of the first conductivity type formed respectively between the channel region of the first conductivity type and the source region and the drain region of the second conductivity type;
wherein the first transistor and the second transistor configure a CMOS.

4. The semiconductor device according to claim 1, wherein the first conductivity type is n type and the second conductivity type is p type.

5. The semiconductor device according to claim 1, wherein the depth of the channel region of the anti-fuse element is at least 0.3 µm.

* * * * *